United States Patent
Kinoshita (10) Patent No.: US 12,149,245 B2
(45) Date of Patent: Nov. 19, 2024

(54) INTERFACE CIRCUIT AND INTERFACE DEVICE

(71) Applicant: Socionext Inc., Kanagawa (JP)

(72) Inventor: Masayoshi Kinoshita, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 120 days.

(21) Appl. No.: 17/974,120

(22) Filed: Oct. 26, 2022

(65) Prior Publication Data

US 2023/0044184 A1    Feb. 9, 2023

Related U.S. Application Data

(63) Continuation of application No. PCT/JP2020/019107, filed on May 13, 2020.

(51) Int. Cl.
*H03K 19/17788* (2020.01)
*H03K 19/0175* (2006.01)

(52) U.S. Cl.
CPC ......... *H03K 19/17788* (2013.01); *H03K 19/017509* (2013.01)

(58) Field of Classification Search
None
See application file for complete search history.

(56) References Cited

U.S. PATENT DOCUMENTS

| | | | |
|---|---|---|---|
| 5,903,167 A | 5/1999 | Sanwo et al. | |
| 6,101,561 A | 8/2000 | Beers et al. | |
| 6,826,390 B1 | 11/2004 | Tamura | |
| 2005/0083102 A1* | 4/2005 | Yonezawa | H03G 1/0029 327/333 |
| 2010/0199005 A1 | 8/2010 | Sogabe | |

FOREIGN PATENT DOCUMENTS

| | | |
|---|---|---|
| JP | H07-044473 A | 2/1995 |
| JP | H10-303731 A | 11/1998 |
| JP | H11-316737 A | 11/1999 |
| JP | 2001-103097 A | 4/2001 |
| JP | 2010-183223 A | 8/2010 |
| JP | 2016-068411 A | 5/2016 |

OTHER PUBLICATIONS

International Search Report (ISR) dated Aug. 18, 2020 issued in International Patent Application No. PCT/JP2020/019107 with English translation.
Written Opinion dated Aug. 18, 2020 issued in International Patent Application No. PCT/JP2020/019107 with partial English translation.

* cited by examiner

*Primary Examiner* — Jany Richardson
(74) *Attorney, Agent, or Firm* — Rimon P.C.

(57) ABSTRACT

An interface circuit includes: a plurality of signal transmitter circuits each receiving an input signal and outputting an output signal responsive to a first power supply voltage based on the input signal; an operation control circuit controlling operation/suspension of the signal transmitter circuits; and an amplitude control circuit exerting control so that the first power supply voltage be greater with increase in the number of operating circuits among the signal transmitter circuits and thereby the amplitude of the output signals of the signal transmitter circuits become greater.

4 Claims, 7 Drawing Sheets

WHEN NECESSARY DATA BAND IS LARGE
16 LANES USED

FIG.4B

WHEN NECESSARY DATA BAND IS INTERMEDIATE
8 LANES USED/
8 LANES SUSPENDED

FIG.4C

WHEN NECESSARY DATA BAND IS SMALL
4 LANES USED/
12 LANES SUSPENDED

INTERFACE CIRCUIT AND INTERFACE DEVICE

CROSS-REFERENCE TO RELATED APPLICATIONS

This is a continuation of International Application No. PCT/JP2020/019107 filed on May 13, 2020. The entire disclosure of this application is incorporated by reference herein.

BACKGROUND

The present disclosure relates to an interface circuit and an interface device.

To achieve inter-chip or inter-apparatus signal communications at high speed, it is a general practice to provide a high-speed communications interface circuit in an LSI. To increase the data band of communications, there are a method in which the signal frequency is increased and a method in which communications are conducted in parallel. It is unable to increase the signal frequency beyond the operating limit of the interface circuit. Therefore, in a system requiring a large data band, communications need to be parallelized.

Japanese Unexamined Patent Publication No. 2010-183223 (Document 1) discloses a communications interface circuit in which the signal amplitude is gradually reduced in the state where the connection is kept established, and the connection is restarted with a signal amplitude a little greater than the amplitude at the time of disconnection. Japanese Unexamined Patent Publication No. 2016-68411 (Document 2) discloses an apparatus in which a power supply circuit outputs a voltage selected from a first voltage and a second voltage greater than the first voltage depending on the presence/absence of a device connected via a connector.

There is however a problem that, as communications are parallelized, the number of signal transmitter circuits increases correspondingly, whereby power consumption becomes large. In a high-speed interface circuit, the power consumption of its signal transmitter circuit, which needs to be operated at high speed, tends to be relatively large. For this reason, when it is intended to reduce the power consumption of the signal transmitter circuit, the amplitude of the output signal needs to be reduced.

On the other hand, when a plurality of signal transmitter circuits are operated, the power consumption of these signal transmitter circuits is large, thereby increasing noise of the power supply. The noise is superimposed on communication signals output from the signal transmitter circuits, causing signal deterioration. To deal with this problem, when the amplitude of the output signals is reduced, signal integrity (e.g., achieving communications without occurrence of a data delivery error) tends to decrease.

That is, a high-speed interface circuit has a problem that it is difficult to achieve both ensuring signal integrity and reducing power consumption.

In the cited Document 1, it is intended to reduce power consumption while ensuring signal integrity by reducing the signal amplitude in the state where the connection is kept established as described above. However, in the technique of the cited Document 1, it is necessary to search for the signal amplitude. That is, after establishment of the connection, there occurs a situation where the connection is temporarily cut off. This raises a problem that it takes time to actually resume the state capable of high-speed communications. Also, the cited Document 1 neither discloses parallelizing signal transmitter circuits, nor describes ensuring signal integrity and reducing power consumption to be achieved when signal transmitter circuits are parallelized.

In the cited Document 2, the output voltage of a power supply circuit is changed depending on the presence/absence of a device connected to the connector, whereby a voltage falling within a prescribed range can be supplied to the device connected to the connector. The cited Document 2 however strictly relates to an invention for optimizing the power supply voltage supplied via the connector. Specifically, as shown in FIG. 3 of the cited Document 2, the cited invention is based on the premise that, even when the output voltage of the power supply circuit is the first voltage (relatively low voltage), communications with the device is possible, and is not such that specific care is given for data signal lines depending on the presence/absence of a device connected to the connector.

In view of the above problems, an objective of the present disclosure is achieving both ensuring signal integrity and reducing power consumption in an interface circuit.

SUMMARY

According to one mode of the present disclosure, an interface circuit includes: a plurality of signal transmitter circuits each receiving an input signal and outputting an output signal responsive to a first power supply voltage based on the input signal; an operation control circuit controlling operation/suspension of the plurality of signal transmitter circuits; and an amplitude control circuit exerting control so that the first power supply voltage be greater with increase in the number of operating circuits among the plurality of signal transmitter circuits and thereby the amplitude of the output signals of the signal transmitter circuits become greater.

The interface circuit of this mode is configured so that the number of signal transmitter circuits operated (hereinafter referred to as the number of operating signal transmitter circuits, or the number of operating circuits) can be changed depending on the magnitude of the necessary band required for the interface circuit. As the number of operating signal transmitter circuits increases, power supply noise becomes greater, increasing variations in output signals. In view of this, in the interface circuit according to the present disclosure, the amplitude control circuit is configured to exert control so that the amplitude of the output signals be greater with increase in the number of operating signal transmitter circuits. With this, signal integrity can be ensured. On the other hand, when the number of operating signal transmitter circuits is relatively small, power supply noise becomes relatively small. In this case, therefore, even when the amplitude of the output signals is made relatively small, signal integrity can be ensured. As the amplitude of the output signals becomes relatively small, power consumption can be reduced correspondingly. In this way, according to the configuration of the present disclosure, both ensuring signal integrity and reducing power consumption can be achieved.

According to the interface circuit of the present disclosure, by exerting control so that the amplitude of output signals be greater with increase in the number of operating signal transmitter circuits, both ensuring signal integrity and reducing power consumption can be achieved.

DETAILED DESCRIPTION

An embodiment of the present disclosure will be described hereinafter with reference to the accompanying drawings. In the following description, a power supply and its voltage are denoted by the same reference character: e.g., the voltage of a first power supply Vs1 is denoted by Vs1. The same holds true for a second power supply Vs2 and a third power supply Vs3.

Figure 1:
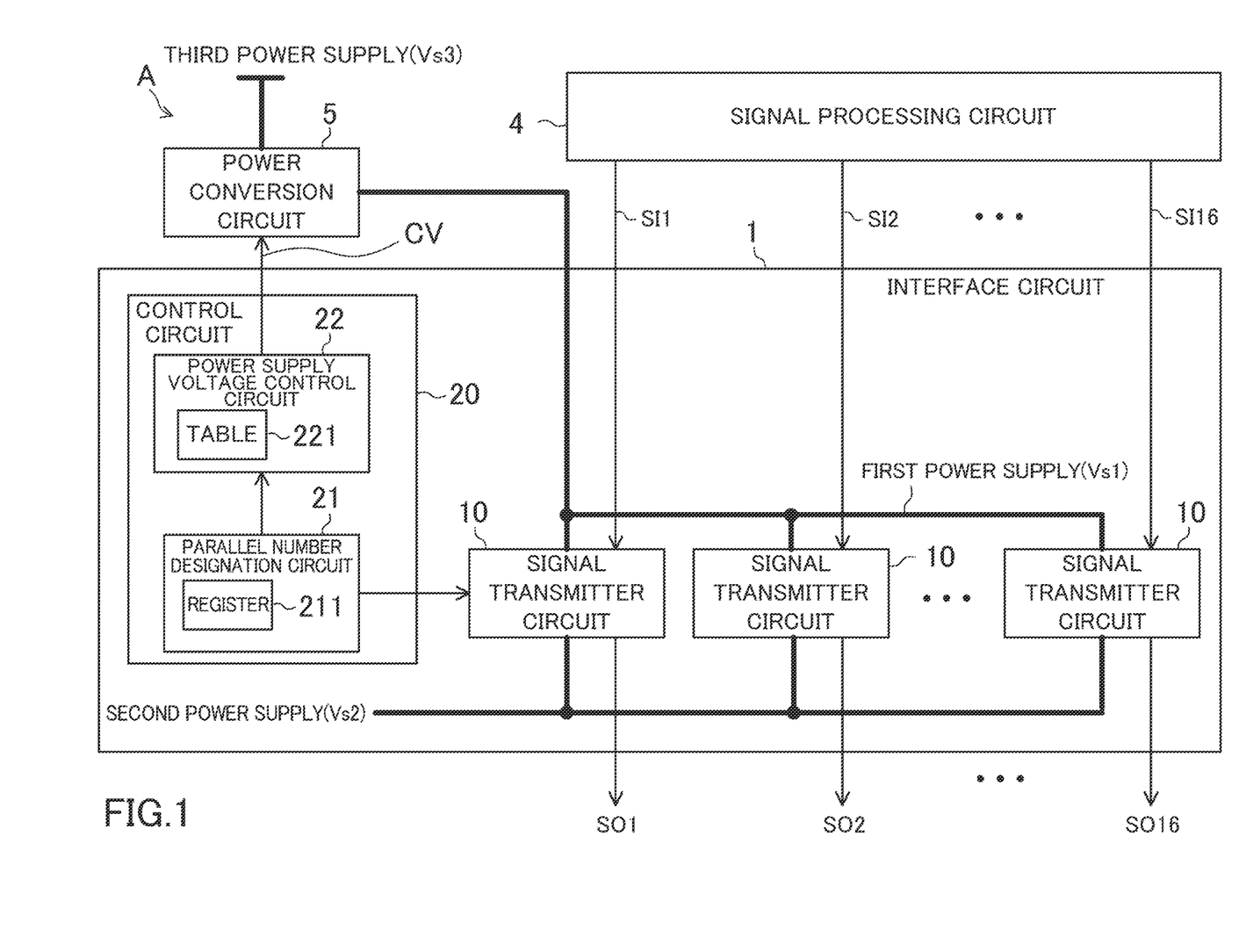
FIG. 1 is a block diagram showing a configuration of an interface device of an embodiment.

As shown in FIG. 1, an interface device A includes an interface circuit 1, a signal processing circuit 4, and a power conversion circuit 5.

The power conversion circuit 5 converts the third power Vs3 to the first power Vs1 and supplies the converted power to each of a plurality of signal transmitter circuits 10 to be described later. The third power supply Vs3 is connected to a power supply line, for example. The power conversion circuit 5 also changes the first power supply voltage Vs1 based on a power control signal CV received from a power supply voltage control circuit 22 to be described later. A known configuration can be used for the power conversion circuit 5. Although not illustrated, (1) the power conversion circuit 5 may be mounted on the same LSI as the interface circuit 1, or (2) the interface circuit 1 may be mounted on an LSI and the power conversion circuit 5 may be provided on a board on which this LSI is mounted. The power conversion circuit 5 is an example of the power supply circuit.

The signal processing circuit 4 generates a signal to be transmitted to a signal transmitter circuit 10 designated as a target of operation by a parallel number designation circuit 21 to be described later, and outputs the signal to the target signal transmitter circuit 10. The signal output from the signal processing circuit 4 is input into the signal transmitter circuit 10 as an input signal SI.

[Interface Circuit]

The interface circuit 1 includes the plurality of signal transmitter circuits 10 and a control circuit 20. The interface circuit 1 is used to achieve inter-LSI chip or inter-apparatus signal communications at high speed.

The signal transmitter circuits 10 are arranged in parallel between the first power supply Vs1 and the second power supply Vs2. The second power supply Vs2 is connected to a ground line, for example. In this embodiment, as an example, 16 signal transmitter circuits 10 are arranged in parallel. Each of the signal transmitter circuits 10 receives a signal processed in the signal processing circuit 4 as an input signal SIx (x is an integer from 1 to 16) and, based on the input signal SIx, outputs an output signal SOx responsive to the first power supply voltage Vs1 supplied from the power conversion circuit 5. The 16 signal transmitter circuits 10 have a common configuration. In the following description, when the signal transmitter circuits 10 are not especially distinguished from one another, the input signal may be simply denoted by SI and the output signal by SO. The number of signal transmitter circuits 10 arranged in parallel is not limited to 16, but may be greater or smaller than 16.

Figure 2A:
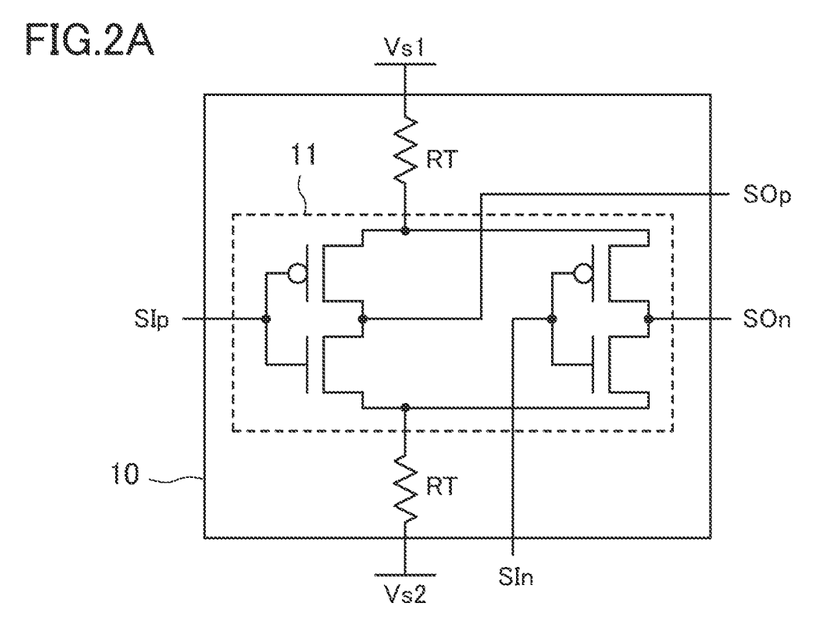
FIG. 2A is a circuit diagram showing an example of a signal transmitter circuit.
Figure 2B:
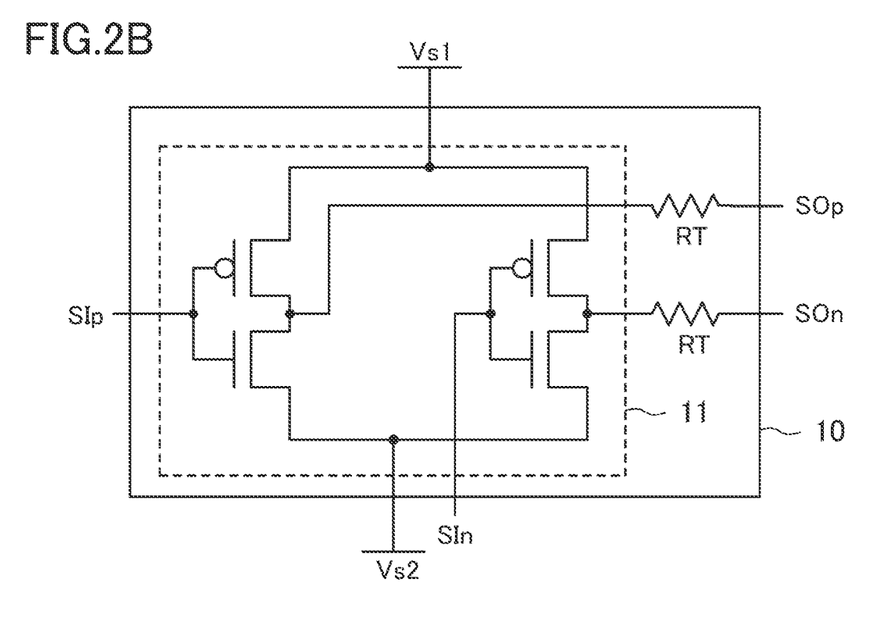
FIG. 2B is a circuit diagram showing another example of the signal transmitter circuit.
Figure 2C:
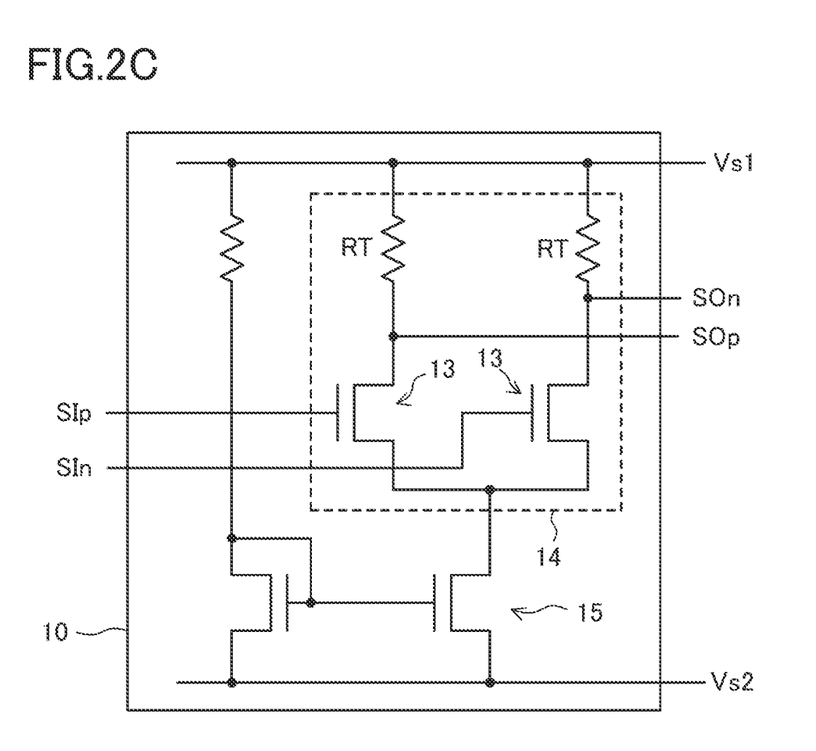
FIG. 2C is a circuit diagram showing yet another example of the signal transmitter circuit.
Figure 2D:
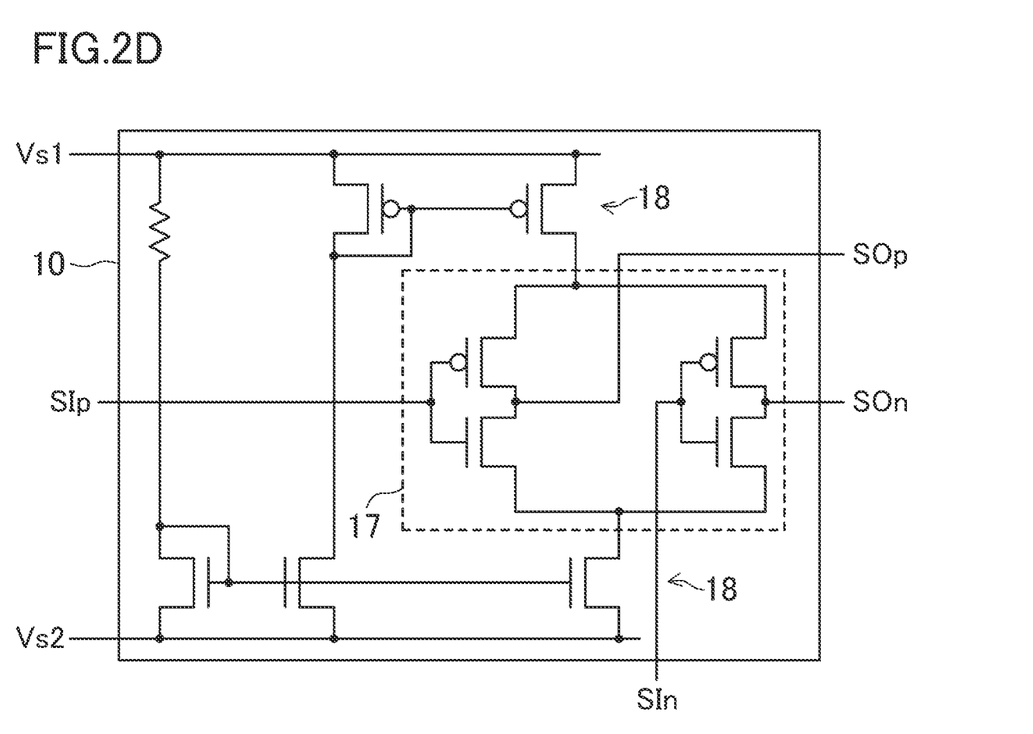
FIG. 2D is a circuit diagram showing yet another example of the signal transmitter circuit.

FIGS. 2A-2D show examples in which each signal transmitter circuit 10 is constituted by a differential circuit. FIGS. 2A and 2B are examples of a voltage-driven circuit, and FIGS. 2C and 2D are examples of a current-driven circuit. In FIGS. 2A-2D, SIp denotes a positive-side input signal, SIn a negative-side input signal, SOp a positive-side output signal, and SOn a negative-side output signal. In the signal transmitter circuits 10 of FIGS. 2A-2D in common, the amplitude of the output signal SO is greater as the first power supply voltage Vs1 rises. Also, with the input of the differential input signals SI (SIp and SIn), the differential output signals SO (SOp and SOn) of the reversed polarity are output.

Specifically, in FIG. 2A, a terminal resistance RT is connected to each of the first power supply Vs1 and the second power supply Vs2, and an inverter-type differential buffer 11 is connected in parallel between the two terminal resistances RT. In FIG. 2B, a differential buffer 11 is connected between the first power supply Vs1 and the second power supply Vs2, and a terminal resistance RT is connected to each of the positive-side output and negative-side output of the differential buffer 11. In FIGS. 2A and 2B, the differential buffer 11 receives the input signal SIp and outputs the output signal SOp of the reversed polarity, and receives the input signal SIn and outputs the output signal SOn of the reversed polarity. In FIG. 2C, serial circuits each having a terminal resistance RT and a transistor 13 are connected in parallel to the first power supply Vs1 to constitute a differential driver 14. A current is supplied to the differential driver 14 from a current mirror-type current source 15 connected to the second power supply Vs2. The differential driver 14 receives the input signal SIp and outputs the output signal SOp of the reversed polarity, and receives the input signal SIn and outputs the output signal SOn of the reversed polarity. In FIG. 2D, currents are supplied from current mirror-type current sources 18 to an inverter-type differential buffer 17 that receives the input signal SIp and outputs the output signal SOp of the reversed polarity, and receives the input signal SIn and outputs the output signal SOn of the reversed polarity. Note that the signal transmitter circuit 10 is not limited to the configurations of FIGS. 2A to 2D, but may be constituted by another differential circuit or a circuit other than differential circuits.

Returning back to FIG. 1, the control circuit 20 includes the parallel number designation circuit 21 and the power supply voltage control circuit 22. The parallel number designation circuit 21 and the power supply voltage control circuit 22 may be operated under the third power supply Vs3 or under another power supply (not shown).

The parallel number designation circuit 21 exerts control of increasing or decreasing the number of signal transmitter circuits 10 operated in parallel, among the plurality of signal transmitter circuits 10, depending on the magnitude of the band of necessary data (hereinafter referred to as the necessary data band). Specifically, the parallel number designation circuit 21 includes a register 211 that stores information on which one or ones of the signal transmitter circuits 10 should be operated or suspended according to the number of operating signal transmitter circuits 10. Based on the information in the register 211, the parallel number designation circuit 21 exerts control of operating or suspending the signal transmitter circuits 10. Also, the parallel number designation circuit 21 outputs the determined number of operating circuits to the power supply voltage control circuit 22. The method of determining the number of operating circuits by the parallel number designation circuit 21 is not specifically limited. For example, the parallel number designation circuit 21 receives information on the necessary data band of the output signals SO of the interface circuit 1 from the signal processing circuit 4 and a circuit (not shown) in an upper layer, and determines the number of operating signal transmitter circuits 10 based on the received information. Note that, although not illustrated, a fuse may be used, or a flipflop or any other storage device may be used, in place of the register 211. The parallel number designation circuit 21 is an example of the operation control circuit that controls operation/suspension of the plurality of signal transmitter circuits 10.

The power supply voltage control circuit 22 determines the first power supply voltage Vs1, with reference to an lookup table 221 incorporated therein, so that the amplitude of the output signals SO of the signal transmitter circuits 10 be an amplitude corresponding to the number of operating signal transmitter circuits 10 received from the parallel number designation circuit 21. Specifically, the first power supply voltage Vs1 is set to be greater as the number of operating signal transmitter circuits 10 increases. The power supply voltage control circuit 22 then outputs the power control signal CV corresponding to the determined first power supply voltage Vs1 to the power conversion circuit 5. The lookup table 221 may be made out previously based on eye patterns obtained when the number of operating signal transmitter circuits 10 and the first power supply voltage Vs1 are changed at the time of evaluation of the interface circuit 1, for example. By doing this, the problem of taking time until the normal state is resumed as in the cited Document 1 will not occur. Note that, although not illustrated, in the power supply voltage control circuit 22, the lookup table 221 may be omitted and instead a logical circuit having a similar function may be used. Otherwise, in place of the lookup table 221, a similar function may be implemented using a CPU and a memory device that are being used in another circuit. The power supply voltage control circuit 22 is an example of the amplitude control circuit.

Figure 3:
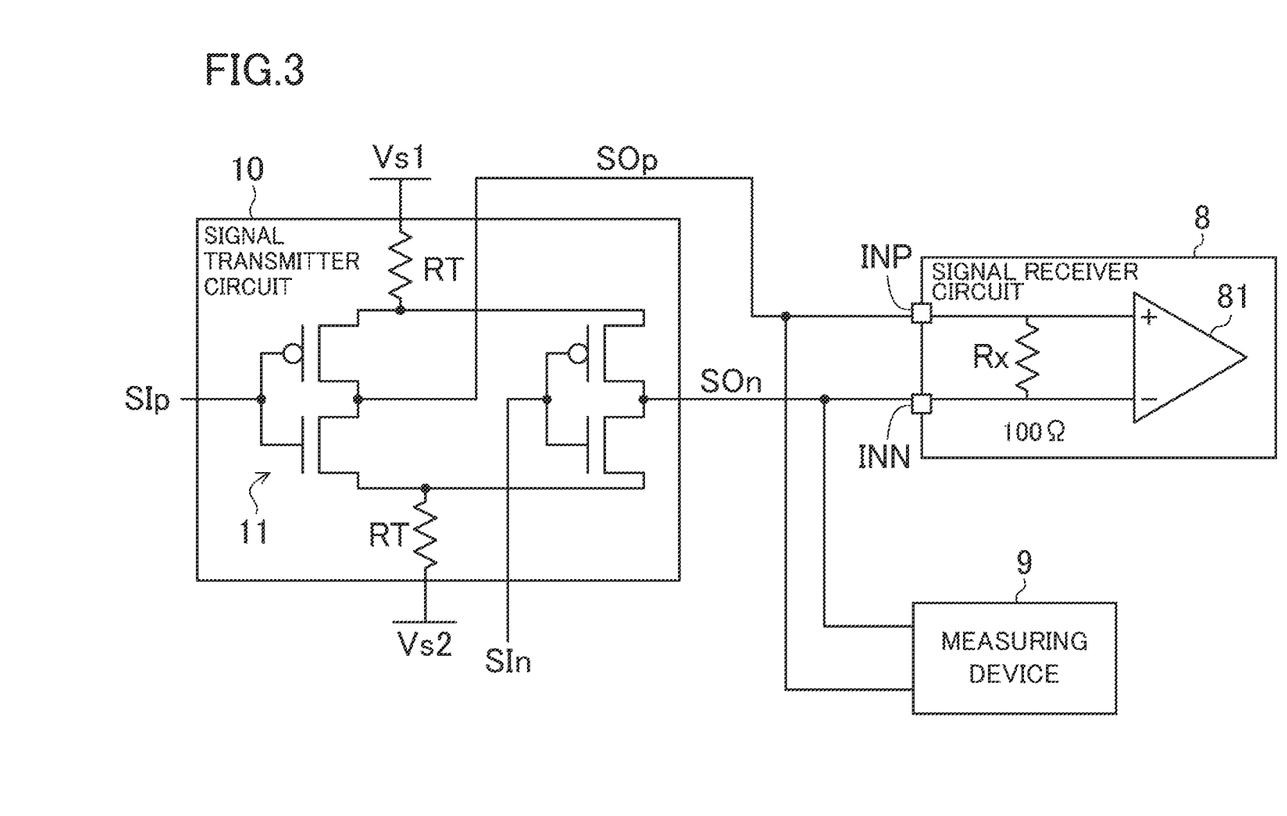
FIG. 3 is a block diagram showing a connection example of an interface circuit of the embodiment and a signal receiver circuit.

FIG. 3 shows a connection example of the signal transmitter circuit 10 and a signal receiver circuit 8, where the circuit of FIG. 2A is used as the signal transmitter circuit 10. The signal receiver circuit 8 is mounted on an LSI chip different from that on which the signal transmitter circuit 10 is mounted, or in an apparatus different from that in which the signal transmitter circuit 10 is mounted.

The signal receiver circuit 8 includes: a terminal resistance Rx connected between a positive-side input terminal INP and a negative-side input terminal INN; and a receiver buffer circuit 81 connected in parallel to the terminal resistance as viewed from the input terminals INP and INN. The positive-side output signal SOp of the signal transmitter circuit 10 is input into the input terminal INP, and the negative-side output signal SOn of the signal transmitter circuit 10 is input into the input terminal INN. When the resistance value of each terminal resistance RT of the signal transmitter circuit 10 is 50 [Ω], the terminal resistance Rx of the signal receiver circuit 8 is set at 100 [Ω]. A configuration of a known differential receiver circuit can be used for the signal receiver circuit 8. In the configuration of FIG. 3, when the second power supply voltage Vs2 is 0 [V], the single-end amplitude of the output signals SOp and SOn output from the signal transmitter circuit 10 is a half of the first power supply voltage Vs1. As a result, the amplitude of the differential signal output from the signal transmitter circuit 10 is equal to the first power supply voltage Vs1 that is the output of the power conversion circuit 5. That is, in the interface circuit 1 of this embodiment, as the first power supply voltage Vs1 rises, the amplitude of the output signals of the signal transmitter circuit 10 becomes greater.

Figure 4A:
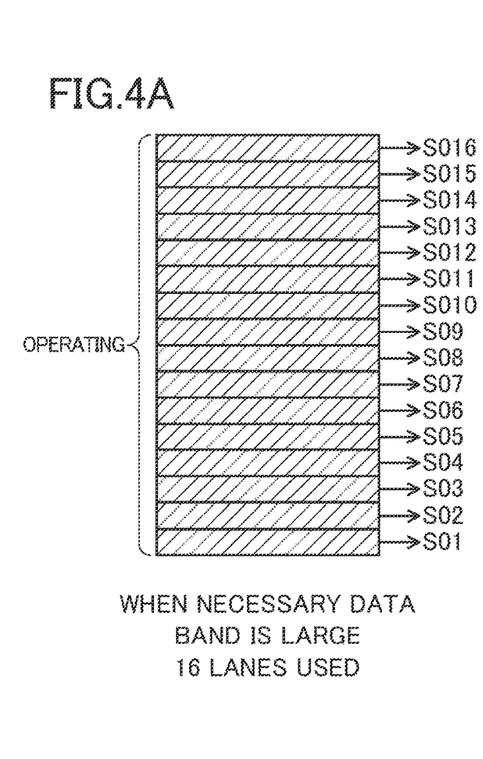
FIGS. 4A-4C are views showing examples of the operation states of the signal transmitter circuits.
Figure 4B:
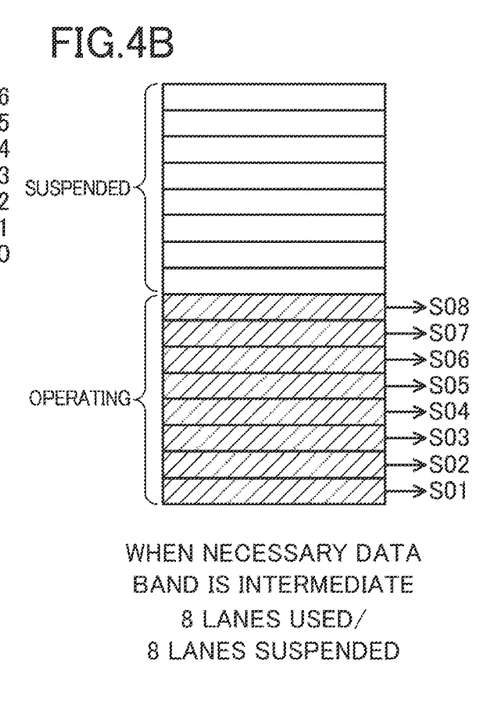
Figure 4C:
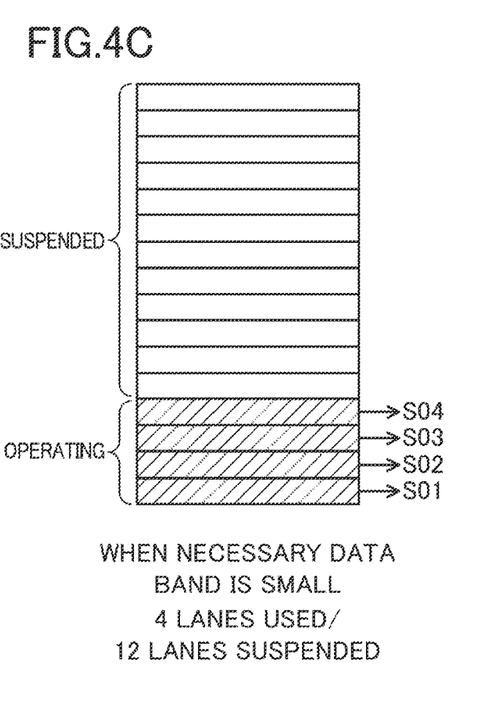

FIGS. 4A-4C show examples of changing the number of signal transmitter circuits 10 operated (the number of operating circuits), among the 16 signal transmitter circuits 10, depending on the necessary data band. In the examples of FIGS. 4A-4C, the parallel number designation circuit 21 makes all of the signal transmitter circuits 10 (16 lanes) operate when the necessary data band is large (see FIG. 4A). It makes eight lanes of signal transmitter circuits 10 operate when the necessary data band is intermediate (see FIG. 4B), and makes four lanes of signal transmitter circuits 10 operate when the necessary data band is small (see FIG. 4C). In other words, the operation of eight lanes of signal transmitter circuits 10 is suspended when the necessary data band is intermediate, and the operation of 12 lanes of signal transmitter circuits 10 is suspended when the necessary data band is small.

The power supply voltage control circuit 22 exerts control so that the amplitude of the output signals SO of the signal transmitter circuits 10 be greatest in FIG. 4A and become smaller as the number of operating circuits decreases in the order of FIG. 4B to FIG. 4C. Since the amplitude of the output signals of the signal transmitter circuits 10 is greater as the first power supply voltage Vs1 rises as described above, the power supply voltage control circuit 22 exerts control so that the first power supply voltage Vs1 be greatest in FIG. 4A and become smaller as the number of operating circuits decreases in the order of FIG. 4B to FIG. 4C. Note that the patterns of the number of operating circuits/the number of suspended circuits are not limited to those in FIGS. 4A-4C.

Figure 5:
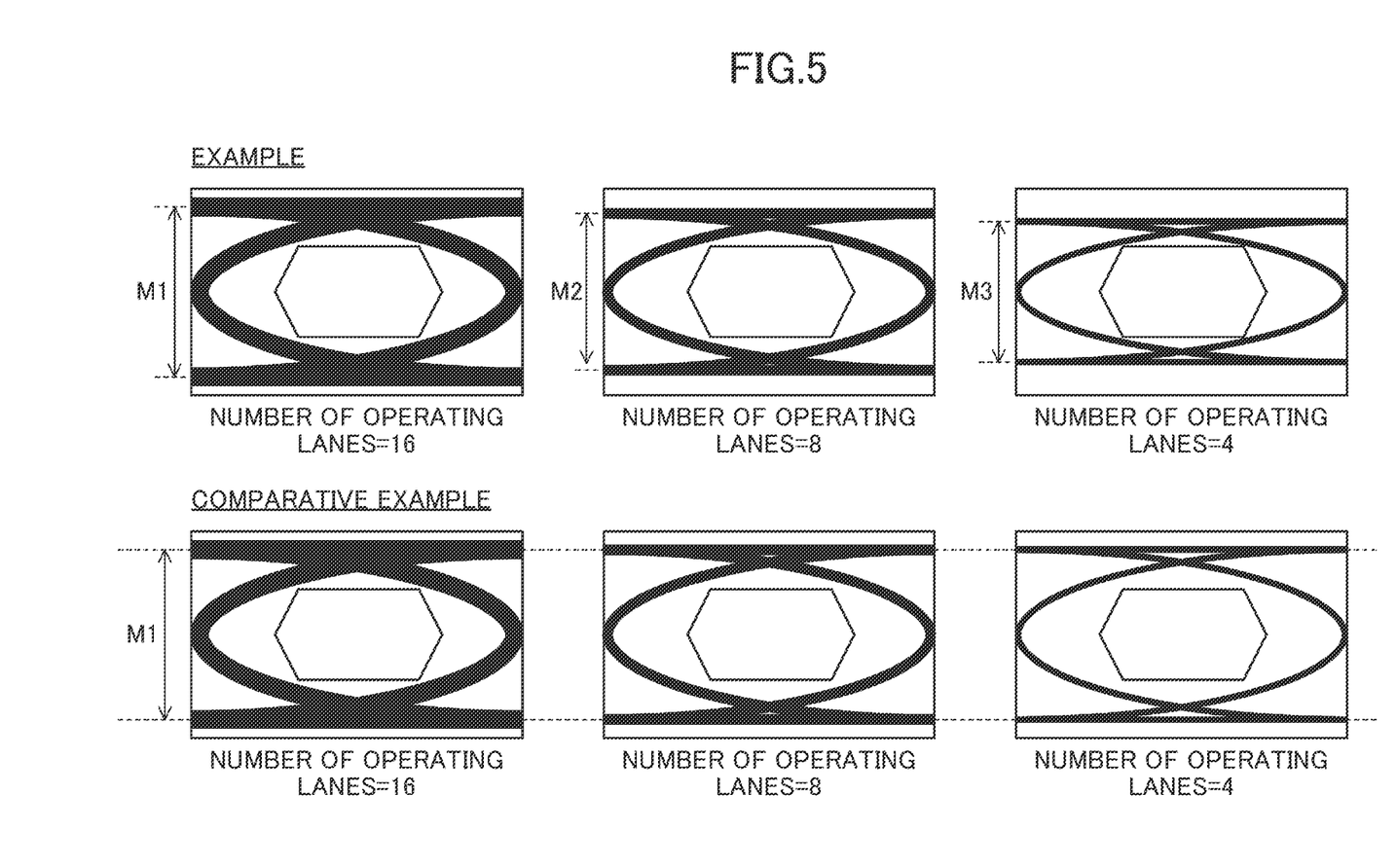
FIG. 5 shows examples of eye patterns of output signals with respect to the number of operating signal transmitter circuits.

FIG. 5 shows examples of eye patterns of the output signals SO with respect to the number of operating signal transmitter circuits 10 shown in the examples of FIGS. 4A-4C. The eye patterns of the output signals SO are measured by a measuring device 9 connected, as shown in FIG. 3, to output signal lines to which the output signals SO of the signal transmitter circuit 10 are output. In FIG. 5, the eye patterns on the left correspond to FIG. 4A, the eye patterns in the center correspond to FIG. 4B, and the eye patterns on the right correspond to FIG. 4C. Also, in FIG. 5, the upper three eye patterns show ones obtained when control has been made for the first power supply voltage Vs1 (examples of this embodiment), and the lower three eye patterns show ones obtained when no control has been made for the first power supply voltage Vs1 (comparative examples).

The eye patterns of FIG. 5 are obtained by superimposing the output signals of a plurality of signal transmitter circuits 10. In FIG. 5, the output signals SO of the signal transmitter circuits 10 are required to pass outside the eye mask shown in a hexagonal shape in the center.

As shown in the left part of FIG. 5, when the number of operating signal transmitter circuits 10 (the number of lanes) is great, the power supply noise becomes great, increasing variations in output signal and thickening the line of the eye pattern. In view of this, the power supply voltage control circuit 22 relatively raises the first power supply voltage Vs1 to relatively increase the amplitude of the output signals SO thereby ensuring the eye pattern to be kept from the eye mask.

As shown in the center and right parts of FIG. 5, when the number of operating signal transmitter circuits 10 is reduced to 8 lanes and to 4 lanes, the power supply noise becomes small, thinning the line of the eye pattern. In this case, in comparison with the case of 16 lanes of the signal transmitter circuits 10, the eye pattern will be well kept from the eye mask even when the first power supply voltage Vs1 is relatively reduced, to relatively reduce the amplitude of the output signals SO and thus reduce the power consumption. The power supply voltage control circuit 22 therefore exerts control so that the amplitude of the output signals SO be smaller when the number of operating power transmitter circuits 10 is 8 lanes than when it is 16 lanes. That is, control is made to reduce the first power supply voltage Vs1. With this, power reduction of the interface circuit 1 can be achieved. When the number of operating signal transmitter circuits 10 is 4 lanes, the amplitude of the output signals SO can be further reduced. That is, the power supply voltage control circuit 22 exerts control so that the first power supply voltage Vs1 be further reduced, whereby power reduction of the interface circuit 1 can be achieved. By contrast, to ensure the signal integrity in the comparative example, it is necessary to set the amplitude of the output signals SO in accordance with the case when the number of operating signal transmitter circuits 10 is 16 lanes.

According to the present disclosure, both ensuring signal integrity and reducing power consumption can be achieved. The present disclosure is therefore useful as an interface circuit used for an LSI, for example.

What is claimed is:

1. An interface circuit, comprising:
    a plurality of signal transmitter circuits each receiving an input signal and outputting an output signal responsive to a first power supply voltage based on the input signal;
    an operation control circuit controlling operation/suspension of the plurality of signal transmitter circuits; and
    an amplitude control circuit exerting control so that the first power supply voltage be greater with increase in the number of operating circuits among the plurality of signal transmitter circuits and thereby the amplitude of the output signals of the signal transmitter circuits become greater,
    wherein the operation control circuit outputs the number of the operating circuits to the amplitude control circuit.

2. An interface device comprising:
    the interface circuit of claim 1; and
    a power supply circuit supplying power of the first power supply voltage to the interface circuit.

3. The interface device of claim 2, wherein
    the interface circuit and the power supply circuit are mounted on a same LSI.

4. The interface circuit of claim 1, wherein the number of the operating circuits among the plurality of signal transmitter circuits is set to increase as a magnitude of a data band increases.

* * * * *